United States Patent
Tang et al.

(10) Patent No.: US 6,734,054 B2
(45) Date of Patent: May 11, 2004

(54) ELECTROSTATIC DISCHARGE PROTECTION CIRCUIT DEVICE AND A MANUFACTURING METHOD FOR THE SAME

(75) Inventors: Tien-Hao Tang, Taipei Hsien (TW); Shiao-Shien Chen, Chung-Li (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 10/186,011

(22) Filed: Jun. 27, 2002

(65) Prior Publication Data

US 2002/0173098 A1 Nov. 21, 2002

Related U.S. Application Data

(62) Division of application No. 09/860,973, filed on May 18, 2001.

(51) Int. Cl.[7] .................. H01L 21/84; H01L 21/332; H01L 23/68
(52) U.S. Cl. .................. 438/197; 438/200; 438/201; 438/133
(58) Field of Search .................. 438/197, 200, 438/201, 227, 238, 133, 564, 380; 257/362, 173, 355–356

(56) References Cited

U.S. PATENT DOCUMENTS

| | | | | |
|---|---|---|---|---|
| 5,856,214 A | * | 1/1999 | Yu ............................. | 438/133 |
| 5,882,967 A | * | 3/1999 | Brown et al. ............... | 438/237 |
| 6,075,276 A | * | 6/2000 | Kitamura .................... | 257/481 |
| 6,281,527 B1 | * | 8/2001 | Chen .......................... | 257/168 |
| 6,400,542 B1 | * | 6/2002 | Lee et al. .................... | 361/56 |
| 6,537,868 B1 | * | 3/2003 | Yu ............................. | 438/237 |
| 6,548,868 B1 | * | 4/2003 | Tsuei et al. ................. | 257/355 |
| 6,642,088 B1 | * | 11/2003 | Yu ............................. | 438/155 |
| 6,653,689 B2 | * | 11/2003 | Okawa ........................ | 257/362 |

* cited by examiner

*Primary Examiner*—Michael Lebentritt
(74) *Attorney, Agent, or Firm*—Charles C. H. Wu; Wu & Cheung, LLP.

(57) ABSTRACT

A structure of an ESD protection circuit device located under a pad, protecting an internal circuit and a method of manufacturing the same are disclosed. The ESD protection circuit device having a pad window, located under a pad, includes a semiconductor substrate having a P-well and an N-well. The P-well and the N-well have an interface. A predetermined area, pad window is selected in the substrate. A first STI structure, a second STI structure and a third STI structure are formed in the substrate within the pad window. N-type doped regions are formed P-well and in the N-well. First p-type doped regions are formed in the P-well and in the N-well and second p-type doped regions are formed in the P-well and in the N-well. A first zener diode is formed in the N-well and a second zener diode is formed in the P-well.

7 Claims, 4 Drawing Sheets

ELECTROSTATIC DISCHARGE PROTECTION CIRCUIT DEVICE AND A MANUFACTURING METHOD FOR THE SAME

This is a divisional patent application of the application Ser. No. 09/860,973, flied on May 18, 2001.

BACKGROUND OF THE INVENTION

1. Filed of Invention

The present invention relates to electronic circuits, and more particularly the present invention relates to a semiconductor electrostatic discharge (ESD) protection circuits and a manufacturing method for the same 2. Description of Related Art In the fabrication of an integrated circuit (IC), ESD is one of the main factors causing IC damage ESD is often seen in the work place. For example, when one walks on a carpet with semiconductor wafers, if relative humidity (RH) is high, an electrostatic voltage of about few hundred volts may exist on one's body and wafers. If the RH is very low, the electrostatic voltage may be even as high as about few thousand volts. If a conductive object occasionally contacts the wafers, a strong ESD could occur and damage the ICs on the wafers. ESD is especially a serious problem during fabrication of a complementary metal oxide semiconductor (CMOS) device In order to protect wafers from ESD damage, many methods to solve the ESD problems have been proposed. The most common conventional method is to make an ESD protection circuit between input/output (I/O) pads on a chip and internal circuits, is designed to begin conducting or to undergo breakdown, thereby providing an electrical path to ground. Since the breakdown mechanism is designed to be nondestructive, the circuits provide a normally open path that closes only when a high voltage appears at the input or output terminals, harmlessly discharging the node to which it is connected. Recently, the spike discharge ESD protection structure is under investigation, In above descriptions, the spike ESD phenomenon occurs around the spike tips on a conductive object because the electric field on the spike is much stronger even though the electrostatic surface charges on the spike tips, where the accumulated electrostatic surface charges are more easily triggered for discharging As the device feature size reduces from sub-micron or even down to deep-submicron ranges, miniaturizing of the feature sizes is desired to reduce the surface area coverage of silicon in order to effectively increase the integration of ICs. Conventional ESD protection devices usually connected between I/O pads and the internal circuits, occupy some surface area on the wafer therefore the integration of ICs is limited. For example, a typical ESD protection circuit device (NPN transistor) having an ESD threshold of about 3.6–3.9 KV for sub-micron CMOS processes, occupies approximately 15 □m×116 □ m (1,740 □m² of silicon area). Ideally, it would be highly desirable to design an ESD protection circuit device that does not occupy any extra surface area on the wafer, thereby substantially increasing the integration of ICs FIG. 1 is a schematic diagram illustrating a conventional ESD protection circuit. Referring to FIG. 1, the ESD current input through the pad 150 is discharged by through a PMOS transistor 170 that leads to a ground $V_{ss}$ so that the internal circuit 180 is protected. Since the NMOS transistor 160 and PMOS transistor 170 of the conventional ESD protection circuit device are located outside the pad, it consumes more available surface of wafer

SUMMARY OF THE INVENTION

As embodied and broadly described herein, the invention is directed towards providing an ESD protection circuit device located under the pad of semiconductor devices and a method for fabricating the same that meets the challenges of reduced spatial availability thereby effectively increasing the integration of ICs. The present invention provides an ESD protection circuit device that does not occupy any extra surface area on the wafer thereby substantially increasing the integration of ICs According to the preferred embodiment, the present invention provides a structure in ESD protection circuit device and a method of fabricating same includes, a substrate is provided and a P-well mid an N-well is formed in the substrate. The P-well and N-well have a well defined interface. A pre-determined area (pad window) crossing over the interface, is selected in the substrate. A first shallow trench isolation (STI) structure, a second STI structure, and a third STI structure are formed in the substrate within the pad window. The first STI structure is located over the interface, the second STI structure is located in the P-well and the third STI structure is located in the N-well. The second STI structure encloses a first inner region that is separated from a first outer region and the third STI structure encloses a second inner region that is separated from a second outer region. N-type doped regions are respectively formed in the first inner region of the P-well and in the second inner region of the N-well. First p-type doped regions are respectively formed in the first outer region of the P-well and in the second outer region of the N-well and second p-type doped regions are respectively formed in the first outer region of the P-well and in the second outer region of the N-well. The second p-type doped region of the P-well is formed under the n-type doped region to have an electrical contact with the n-type doped region in the P-well to form a zener diode. The second p-type doped region of the N-well is formed under the n-type doped region to have an electrical contact with the n-type doped region in the N-well to form another zener diode.

The n-type doped region of the N-well is electrically connected to power source VDD, the n-type doped region of the P-well and the p-type doped region of the N-well are electrically connected to the pad, and the p-type doped regions of P-well are electrically connected to ground $V_{ss}$.

It is understood from the above embodiment that the invention protects a semiconductor internal circuitry from an ESD discharge through the ESD protection circuit device using zener diodes, located under the pad. Because the zener diodes are located under the pad, the ESD protection circuit device does not occupy extra surface area on the wafer thereby substantially increasing the integration of ICs.

It is to be understood that the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and together with the description serve to explain the principles of the invention. In the drawings.

DESCRIPTION OF THE PREFERRED EMBODIMENTS

Figure 1:
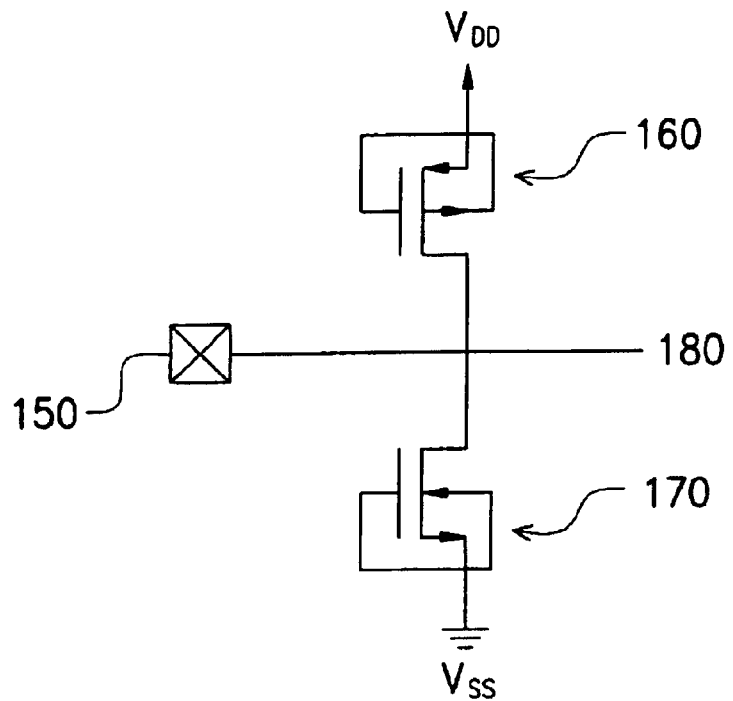
FIG. 1 is a schematic circuit showing the conventional ESD protection circuit.
Figure 2:
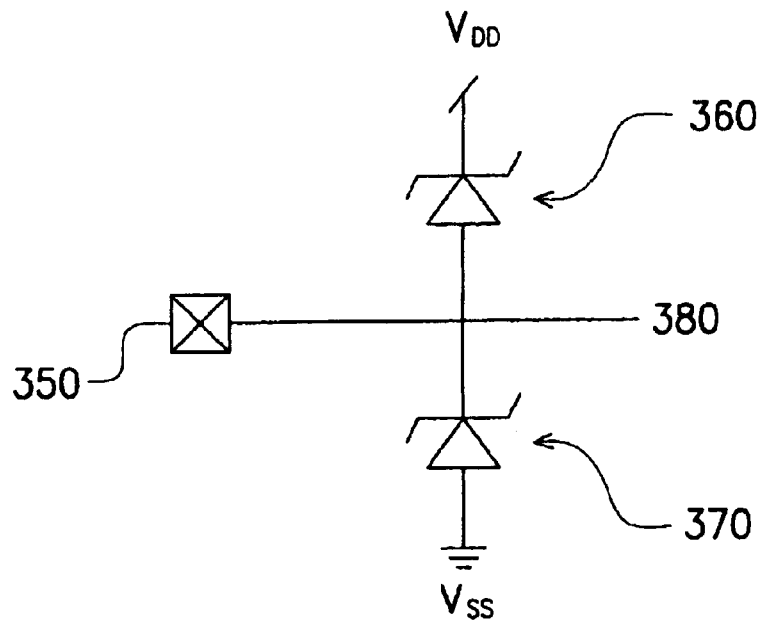
FIG. 2 is a schematic circuit showing an ESD protection circuit according to the present invention.

Reference will be made in detail to the present preferred embodiments of the invention, examples of which are illustrated in the accompanying drawings. Wherever possible, the same reference numbers are used in the drawings and the description to refer to the same or like parts FIG. 2 is a schematic circuit showing an ESD protection circuit according to the present invention. Referring to FIG. 2, the ESD current input by a pad 350 is discharged by through a zener diode 370 that leads to ground Vss so that the internal circuit 380 is protected. It is to be understood that the zener diodes 360 and 370 are located under the pad, therefore the ESD protection circuit device does not occupy any extra surface area on the wafer and thereby substantially increasing the integration of semiconductor devices.

Figure 4:
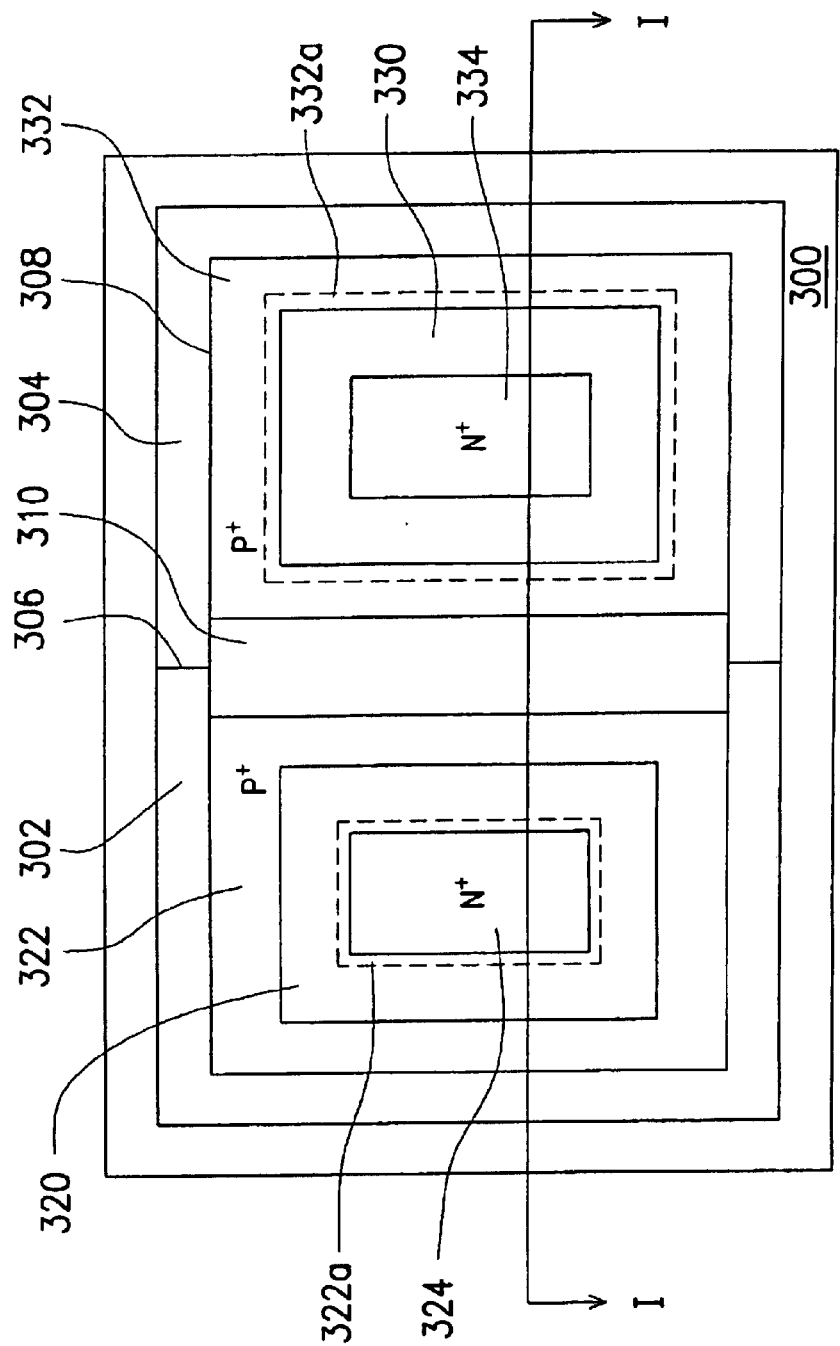
FIG. 4 is a schematic, top view showing the ESD protection circuit device structure according to the preferred embodiment of the present invention.

FIG. 4 is a schematic, top view showing an ESD protection device structure according to the preferred embodiment of the present invention.

In FIG. 4, a schematic top view diagram of an ESD protection circuit device shows a P-well 302 and an N-well 304 in a semiconductor substrate 300. For example, the P-well 302 can be formed by implanting lower concentration of dopants, such as boron, and the N-well 304 can be formed by implanting lower concentration of dopants such as phosphorous. The P-well 302 and the N-well 304 have a well defined interface 306. A pre-determined area 308 (pad window) crossing over the interface 306 is selected in the substrate 300. A first shallow trench isolation (STI) structure 310, a second STI structure 320, and a third STI structure 330 are formed in the substrate 300 within the pad window 308. The first STI structure 310 is located over the interface 306 between the P-well 302 and N-well 304, the second STI structure 320 is located in the P-well 302, the third STI structure 330 is located in the N-well. The second STI structure 320 encloses a first inner region 324 that is separated from a second outer region 322. The third STI structure 330 encloses a second inner region 334 that is separated from a second outer region 332. N-type dopants are implanted into the regions 324 and 334 to form n-type doped regions 324 and 334. For example, the n-type doped regions 324 and 334 are formed by implanting phosphorous at a higher concentration than the N-well 304. P-type dopants are implanted into the regions 322 and 332 to form first p-type doped regions 322 and 332. For example, the first p-type doped regions 322 and 332 are formed by implanting boron at a concentration higher than the P-well 302. Second p-type doped regions 322a and 332a are formed under the n-type doped regions 324 and 334 respectively using higher energy levels of p-type dopants. For example, the second p-type doped regions 322a and 332a are formed by implanting boron with a dosage level slightly lower than the first p-type doped region 322 and 332. The second p-type region 322a is formed under the n-type doped region 324 to have an electrical contact with the n-type doped region 324 in the P-well 302 to form a second zener diode 370 in the P-well. The second p-type doped region 332a is formed under the n-type doped region 334 to have an electrical contact with the n-type doped region 334 in the N-well 304 to form a first zener diode 360 in the N-well.

FIGS. 3A–3D are schematic, cross sectional view along the line I—I in FIG. 4, schematically illustrating a fabrication process according to the preferred embodiment of the present invention.

Figure 3A:
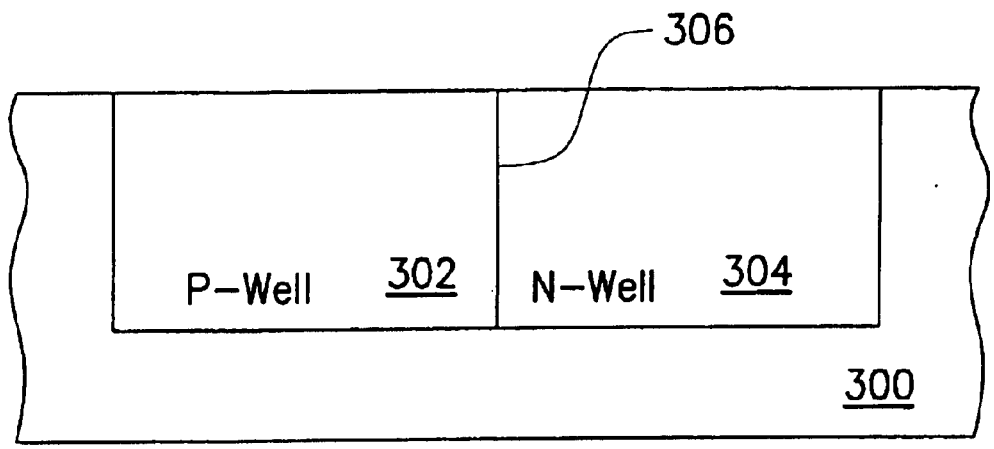
FIGS. 3A–3D are schematic, cross sectional view along the line I—I in FIG. 4, schematically illustrating a fabrication process according to the preferred embodiment of the present invention.

In FIG. 3A, a method includes, a substrate 300 is provided, and a P-well 302 and an N-well 304 are formed in the substrate 300. The P-well 302 and N-well 304 have a well defined interface 306. For example, the P-well 302 can be formed by implanting lower concentration of p-type dopants such as boron and the N-well 304 can be formed by implanting lower concentration of n-type dopants such as phosphorous.

Figure 3B:
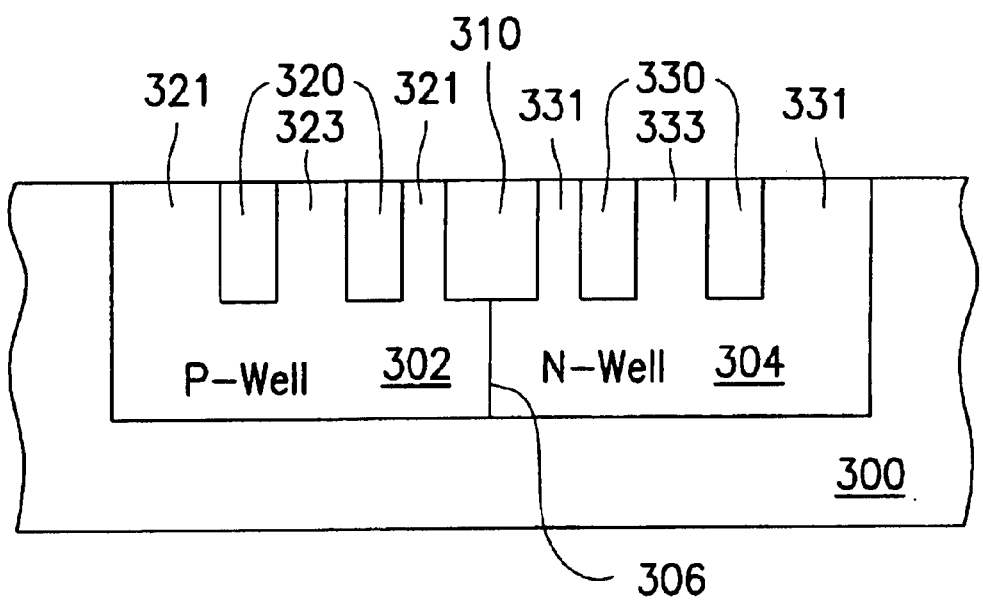

In FIG. 3B, a pre-determined area 308 (pad window 308, as shown in FIG. 4) crossing over the interface 306 is selected in the substrate 300. The pad window 308 will eventually be aligned under the I/O pad of a semiconductor device. A first shallow trench isolation (STI) 310, a second STI structure 320 and a third STI structure 330 are formed in the substrate 300 within the pad window 308. The first STI structure 310 is located over the interface 306 between the P-well 302 and the N-well 304, the second STI structure 320 is located in the P-well 302, and the third STI structure 330 is located in the N-well 304. The second STI structure 320 encloses a first inner region 323 that is separated from a second outer region 321. The third STI structure 330 encloses a second inner region 333 that is separated from a second outer region 331. It is to be understood that FIG. 3B is a cross sectional view along the line I—I of FIG. 4, therefore the second STI structure 320 in the P-well 302 shown in FIG. 3B is actually a single STI structure 320 as shown in FIG. 4, likewise, the third STI structure 330 in N-well 304 is also a single STI structure 330 as shown in FIG. 4.

Figure 3C:
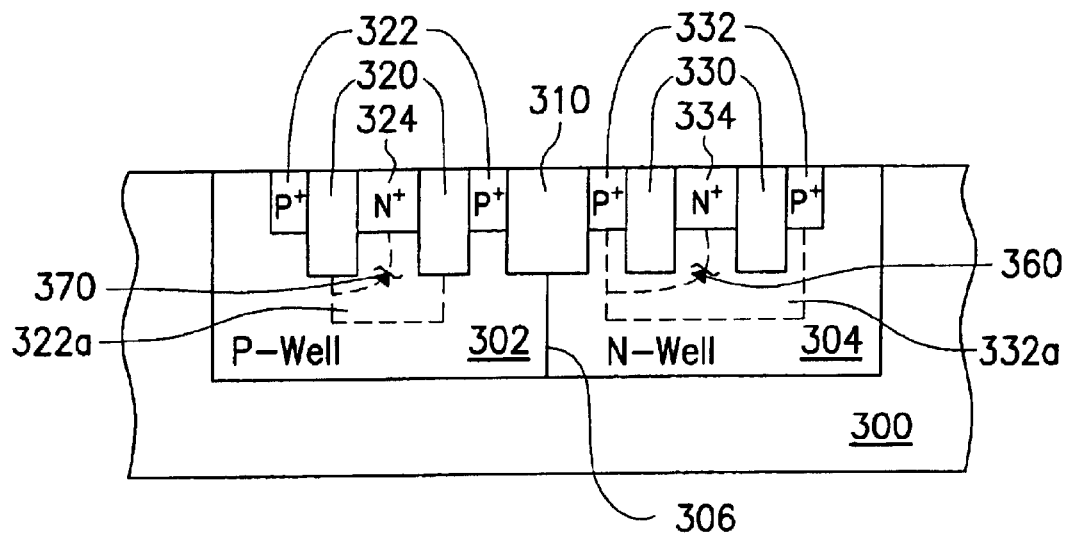

In FIG. 3C, n-type dopants are implanted into the regions 323 and 333 to form n-type doped regions 324 and 334. For example, the n-type doped regions 324 and 334 are formed by implanting phosphorous at a higher concentration than the N-well 304. A p-type dopants are implanted into the regions 321 and 331 to form first p-type doped regions 322 and 332. For example, the first p-type doped regions 322 and 332 are formed by implanting boron at a concentration higher than the P-well 302. Second p-type doped regions 322a and 332a are formed under the n-type doped regions 332 and 334 respectively using higher energy levels of p-type dopants. For example, the second p-type doped regions 322a and 332a are formed by implanting boron with a dosage level slightly lower than the first p-type doped region 322 and 332. The second p-type region 322a is formed under the n-type doped region 324 to have an electrical contact with the n-type doped region 324 in the P-well 302 to form a second zener diode 370 in the P-well 302. The second p-type doped region 332a is formed under the n-type doped region 334 to have an electrical contact with the n-type doped region 334 in the N-well 304 to form a first zener diode 360 in the N-well 304. It is to be understood that FIG. 3C is a cross sectional view of FIG. 4, therefore the first p-type doped regions 322. In P-well 302 shown FIG. 3C is actually a single first p-type doped region 322 surrounding the n-type doped region 324, separated by the second STI structure 320 as shown in FIG. 4. Similarly, the first p-type doped regions 332 in N-well 304 is a single p-type region 332 surrounding the n-type doped region 334, separated by the third STI structure 330 as shown in FIG. 4.

Figure 3D:
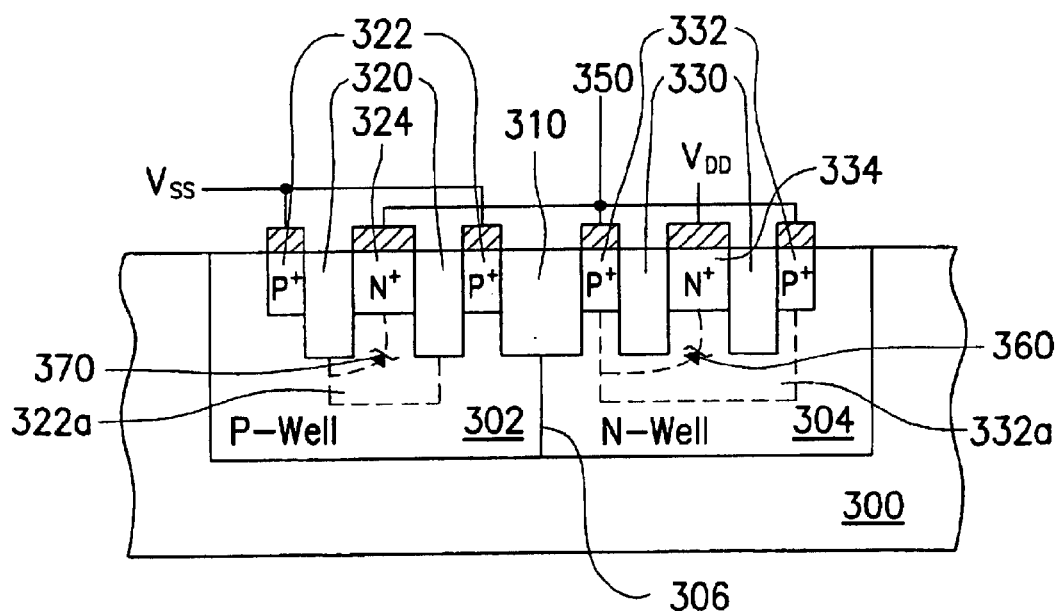

In FIG. 3D, the n-type doped region 334 of the N-well 304 is electrically connected to power source VDD, the n-type doped region 324 of the P-well 302 and the p-type doped region 332 of the N-well 304 are electrically connected to the pad, and the p-type doped region 322 of P-well 302 are electrically connected to ground $V_{ss}$.

During an ESD event, the ESD current input by a pad 350 is discharged by through a zener diode 370 that leads to ground Vss so that the internal circuit 380 is protected. Since the zener diodes 360 and 370 are located under the pad, the ESD protection device does not occupy any extra space on the wafer, thereby substantially increasing the integration of ICs.

In summary, the present invention provides an ESD protection circuit located under the pad that does not occupy extra surface area on the wafer thereby substantially increasing the integration of ICs.

It will be apparent to those skilled in the art that various modifications and variations can be made to the method and the structure of the present invention without departing from the scope or spirit of the invention. In view of the foregoing, it is intended that the present invention cover modifications and variations of this invention provided they fall within the scope of the following claims and their equivalents

What is claimed is:

1. A method of manufacturing an ESD protection circuit located under a pad which is to be formed later, the method comprising the steps of:

providing a substrate;

forming a P-well and an N-well in a substrate wherein an interface is formed between the P-well and the N-well;

selecting a pad window in the substrate, wherein the pad window crosses over the interface, wherein the pad window is located under the pad which is to be formed later;

forming a first shallow trench isolation structure, a second shallow trench isolation structure and a third isolation structure in the substrate within the pad window, wherein the first shallow trench isolation structure is located over the interface, the second shallow trench isolation structure is located in the P-well, and the third shallow trench isolation structure is located in the N-well, wherein in the P-well, the second shallow trench isolation structure encloses a first inner region that is separated from a first outer region and in the N-well, the third shallow trench isolation structure encloses a second inner region that is separated from a second outer region;

respectively forming n-type doped regions in the first inner region of the P-well and in the second inner region of the N-well;

respectively forming first p-type doped regions in the first outer region of the P-well and in the second outer region of the N-well; and respectively forming second p-typo doped regions in the outer regions and under the n-type doped regions, wherein one of the second p-type doped regions, which is under the second inner region, has an electrical contact with the n-type doped region in the N-well to form a first zener diode, and another of the second p-type doped regions, which is under the first inner region, has an electrical contact with the n-type doped region in the P-well to form a second zener diode.

2. The method of claim 1, wherein the P-well is formed by implanting boron.

3. The method of claim 1, wherein the N-well is formed by implanting phosphorous.

4. The method of claim 1, wherein the first p-type doped region in the P-well and the first p-type doped region in the N-well are formed by implanting boron with a concentration higher than the P-well.

5. The method of claim 1, wherein the second p-type doped region in the P-well and in the N-well are formed by implant boron at higher energy levels than the first p-type doped region.

6. The method of claim 1, wherein the n-type doped region in the P-well and in the N-well are formed by implanting phosphorous with a concentration higher than the N-well.

7. The method of claim 1, further comprising forming a pad, wherein the first p-type doped region of the N-well is electrically connected to the pad, the n-type doped region of the N-well is electrically connected to a system power source; and the first p-type doped region of the P-well is electrically connected to ground.

\* \* \* \* \*